(12) United States Patent
Yang et al.

(10) Patent No.: US 7,310,786 B2
(45) Date of Patent: Dec. 18, 2007

(54) IC COMPACTION SYSTEM

(75) Inventors: Lu-Tsann Yang, Taipei (TW);
Chun-Chi Tsai, Taipei (TW)

(73) Assignee: Springsoft, Inc., Hsinchu (TW)

( * ) Notice: Subject to any disclaimer, the term of this patent is extended or adjusted under 35 U.S.C. 154(b) by 441 days.

(21) Appl. No.: 11/051,074

(22) Filed: Feb. 3, 2005

(65) Prior Publication Data

US 2006/0190847 A1    Aug. 24, 2006

(51) Int. Cl.
*G06F 17/50* (2006.01)
(52) U.S. Cl. .................. 716/2; 716/8; 716/9; 716/10; 716/11
(58) Field of Classification Search ............... 716/2, 716/8–11
See application file for complete search history.

(56) References Cited

U.S. PATENT DOCUMENTS

| | | | | |
|---|---|---|---|---|
| 5,381,343 A * | 1/1995 | Bamji et al. | | 716/2 |
| 5,535,134 A * | 7/1996 | Cohn et al. | | 716/8 |
| 5,604,680 A * | 2/1997 | Bamji et al. | | 716/8 |
| 5,612,893 A * | 3/1997 | Hao et al. | | 716/2 |
| 6,189,132 B1 * | 2/2001 | Heng et al. | | 716/11 |
| 6,446,239 B1 | 9/2002 | Markosian et al. | | |
| 6,574,779 B2 * | 6/2003 | Allen et al. | | 716/1 |
| 6,587,992 B2 | 7/2003 | Marple | | |
| 6,986,109 B2 * | 1/2006 | Allen et al. | | 716/2 |
| 2005/0188338 A1 * | 8/2005 | Kroyan et al. | | 716/9 |

* cited by examiner

*Primary Examiner*—Jack Chiang
*Assistant Examiner*—Naum B. Levin
(74) *Attorney, Agent, or Firm*—Daniel J. Bedell; Smith-Hill and Bedell

(57) ABSTRACT

An integrated circuit (IC) layout includes an arrangement of instances of cells, wherein each cell describes a separate corresponding electronic device to be incorporated into the IC. An internal layout of each cell includes one or more objects corresponding to portions of IC material that are to form the corresponding electronic device, and the shape and position of each object within the cell layout represents the shape and position of the corresponding portion of IC material within the corresponding electronic device. When a dimension or position of an object within a cell's internal layout can be altered without affecting the behavior of the electronic device the cell describes, a device rule is created for that cell to indicate any constraint on that object's dimension or relative position. The IC layout is then compacted both by moving cell instances closer together, and also by altering internal layouts of cell instances in a manner consistent with their device rules.

20 Claims, 12 Drawing Sheets

IC COMPACTION SYSTEM

BACKGROUND OF THE INVENTION

1. Field of the Invention

The present invention relates to an automated compaction system for repositioning cell instances within an integrated circuit (IC) layout to reduce IC floor space, and more particularly to a compaction system that also modifies the internal layouts of the cell instances.

2. Description of Related Art

An integrated circuit (IC) fabricator typically manufactures an IC by doping a semiconductor substrate to form a pattern of rectilinear doped areas of various sizes and shapes and then successively laying down several layers of various types of material over the substrate, with each layer being etched or deposited to form a pattern of rectilinear shapes. An IC designer produces an IC design in the form of an IC layout, a data file describing the substrate doping pattern and the patterns for each layer of material above the substrate, and the IC manufacturer uses the layout as a guide for fabricating the IC.

The rectilinear areas of doped semiconductor substrate and the other rectilinear objects formed on the higher layers of the IC form electronic devices such as transistors, capacitor and resistors, and also form conductors for interconnecting the devices. An IC designer will usually create an IC initially in the form of a netlist describing an IC at a relatively high level of abstraction; for example, by a set of Boolean expressions describing the logic the IC is to carry out. The designer will then employs various automated tools to covert the high level netlist into a gate level netlist describing the IC as a collection of interconnected instances of standard cells, where each cell describes the layout of a device such as a transistor, a capacitor, a resistor, a logic gate or other device. The gate level netlist also indicates which terminals of the cells are to be interconnected by conductive nets. The gate level netlist describes each cell instance only indirectly by referring it as an instance of a standard cell described in a cell library. The designer then uses a computer-aided placement and routing tool to generate the IC layout based on the gate level netlist. The placement and routing tool automatically determines how to position and orient each cell within the layout for each cell instance and how to form the nets interconnecting them from objects on various layers of the IC. The placement and routing tool obtains the internal layout for each cell instance from the cell library.

A designer may use graphic tools to manually generate a layout for a custom devices not included in the cell library, thereby creating a new cell for a cell library. The new cell may be hierarchical in that it incorporates instances of existing cells. For example a new gate cell may incorporate instances of various types of existing transistor cells.

After creating an initial layout for a portion of an IC, for an entire IC, or for a new IC cell, the designer will sometime use a computer-aided compaction tool (a compactor) 10 as illustrated in FIG. 1 to modify the initial layout 11 by repositioning cells and the nets that interconnect them to produce a compacted layout 12 that takes up less floor space within an IC. For example FIG. 2 shows how compactor 10 might convert a simple, initial layout 11 having four cells A-D interconnected by nets 15 to produce a compacted IC layout 12 where the cells are closer together.

When compacting the initial layout 11, compactor 10 must ensure that that compacted layout 12 satisfies a set of design rules 17 imposed by the IC fabricator that place limits on the dimensions of and spacing between objects formed on the various layers of the IC. For example, as shown in FIG. 3, a design rule may specify a minimum distance d1 between two objects A and B on the same layer of a layout, or a minimum dimension d2 for an object A as shown in FIG. 4. As illustrated in FIG. 5, a design rule may specify that the edges of object A on one layer of the IC residing above another object B must be horizontally spaced from the edges object B residing on another layer of the IC by some minimum distance d3.

Such design rules 17 place constraints on how a compactor 10 can reposition cells A-D and nets 15 of initial layout 11 of FIG. 2 when forming the compacted IC layout 12. Since various objects subject to design rule constraints form the cell instances and nets, a compactor risks violating design rules by moving cell instances closer together. For example, FIG. 6A shows a cell instance 36 formed by a set of objects 38-43 positioned near another object 44 within a layout. Design rules might subject the distance between the material forming objects 40 and 44 to a minimum spacing constraint. A compactor might therefore move cell instance 36 closer to object 44 as illustrated in FIG. 6B, but no closer than the point at which the spacing between objects 40 and 44 satisfies the minimum spacing constraint d1 between objects 40 and 44 as illustrated in FIG. 6B. Note that in doing so, the compactor causes objects 38 and 44 to overlap, but this is permissible when no design rule prohibits overlap of the material forming objects 38 and 44. Thus a compactor must take into account the internal layout of each instance cell when compacting a layout to make sure that in bringing cell instances closer together it does not violate design rules limiting the spacing between objects forming those cell instances. However a conventional compactor does not reposition objects within a cell instance because the relative positions of objects forming a cell instance can influence the electrical behavior of the cell instance.

As illustrated in FIG. 7, a typical compactor uses a two-phase process to compact a layout, by first compacting the layout in an X direction within the plane of the IC layout and then compacting the layout in an orthogonal Y direction. The compactor initially (step 20) builds a graph modeling the relative position of the object boundaries along the X direction and indicating the minimum spacing between edges mandated by the design rules. It then uses well-known graph theory techniques to "solve the graph" (step 22) by finding a position for each edge that maximizes the amount of layout compression in the X direction while satisfying the design rules. The compactor then converts the graph solution into a new layout compressed in the X direction. Using the x-direction compressed layout as input, the compactor then repeats the process to compress the layout in the Y direction, building graph modeling the relative positions of edges in the Y direction (step 26), solving that graph (step 28) and then converting the graph solution back into a layout that is compressed in both the X and Y directions (step 30).

FIG. 8 shows a simple example of an uncompressed layout having four objects A-D residing in a placement area having X-direction boundaries S1 and S2. Object A has X-direction boundaries $A_1$ and $A_2$, object B has X-direction boundaries $B_1$ and $B_2$, object C has X-direction boundaries $C_1$ and $C_2$, and object D has X-direction boundaries $D_1$ $D_2$. The design rules specify minimum spacings between edges of the objects in the layout, and the double arrows in FIG. 8 extend between edges that are subject to minimum spacing design rules. The number above each double arrow indicates a minimum space between the objects permitted by the design rules. Thus edges A2 and D1 must be at least one unit apart, edges A2 and C1 must be at least one unit apart, and edges B2 and C1 must be at least one unit apart. In this example, all of the objects are two dimension units wide.

In carrying out step 20 of FIG. 7, the compactor generates a graph as illustrated in FIG. 9 in which the edges S1 and S2 of the placement area, and the edges A1, A2, . . . D1, D2 of the objects correspond to nodes of the graph, arrows (directed vertices of the graph) represent spatial relationships between edges, with a number next to each edge indicating the minimum allowable spacing between the edges. A number next to each node indicates the current position of the edge corresponding to the node in the X-direction.

As it solves the graph (step 22 of FIG. 7), the compactor tries to find a coordinate for each node that will minimize the distance between S1 and S2. However in doing so, the compactor must not change the width of any object and must ensure that the spacing between object edges satisfies the design rules.

FIG. 10 shows a solution to the graph of FIG. 9 providing minimum spacing between edges. The graph of FIG. 10 shows that the compactor should move objects B and C one unit in the -X direction, and should move object D two units in the -X direction. This will allow the compactor to move area edge S2 two units in the -X direction as illustrated in FIG. 11, thereby shrinking the placement area from 7 units wide to 5 units wide when the compactor modifies the layout (step 24 of FIG. 7) in accordance with the solution graph of FIG. 11.

The compactor next processes the new X direction compacted layout (step 26 of FIG. 7) to produce a graph modeling edge positions in the Y direction. FIG. 12 shows the labeling of object area edges associated with the nodes of the resulting graph for use in connection with Y-direction compaction. FIG. 13 shows a Y-direction graph modeling the layout of FIG. 12, and FIG. 14 illustrates the solution to the graph of FIG. 13 the compactor produces at step 28 of FIG. 7. FIG. 15 illustrates the resulting layout the compactor produces at step 30 of FIG. 7 that has been compacted in both the X and Y directions.

U.S. Pat. No. 6,587,992, issued Jul. 1, 2003 to Marple describes a two-dimensional compaction system the carries out compaction in both X and Y directions at the same time.

While prior art compactors can compact an IC layout by repositioning cells in a manner consistent with design rules, or by replacing cells, the amount by which they can compact a layout is limited by the need to maintain adequate spacing between cells and by the dimensions and internal layouts of the individual cells incorporated into the design. U.S. Pat. No. 6,446,239 issued Sep. 3, 2002 teaches to replace some of the cells within an IC layout when doing so can help reduce the dimensions of an IC layout. However here too, the dimensions and internal layouts of available cells limit the ability of the compaction system to compact the layout.

BRIEF SUMMARY OF THE INVENTION

The invention relates to a system for compacting an integrated circuit (IC) layout formed by cell instances describing devices such as transistors, resistors and capacitors, and the nets that interconnect them so that the layout occupies less space within an IC.

In accordance with one aspect of the invention, when a dimension or relative position of an object forming a part of a cell for an electronic device can vary without altering the behavior of the device, a "device rule" is created for that cell to indicate limits on that dimension or relative position. Thus each cell formed by objects that can vary in dimension or position has associated with it a set device rules indicating limitations on such variations.

When a compaction system in accordance with the invention compacts an IC layout containing one or more instances of such a cell, it modifies the dimensions and/or positions of objects forming each cell instance in a manner consistent with the device rules, when doing so helps to compact the IC layout.

It is accordingly an object of the invention to provide an improved compaction system which not only compacts the layout by repositioning cell instances and nets, but also by altering dimensions and relative positions of objects within the layouts of individual cell instances when doing so does not alter the function of devices they describe.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The present invention relates to a method and apparatus for compacting an integrated circuit (IC) layout. The invention is suitably implemented by providing software stored on computer-readable media which, when read and executed by a conventional computer causes the computer to carry out an IC layout compaction method in accordance with the invention. Suitable computer-readable media include, but are not limited to, compact disks, hard disks, read only and random access memory. While the specification describes at an exemplary embodiment of the invention considered a best mode of practicing the invention, the invention is not limited to the particular example described below or to the manner in which it operates.

The electronic devices such as transistors, resistors, capacitors, gates, memories, microprocessors, and the like that are incorporated into an IC are formed from objects residing on various layers of the IC. A cell library describes a set of standard cells that a designer can incorporate into an IC layout where each cell describes the internal layout of a separate electronic device that can be incorporated into an IC. The layout for a cell includes a description of the size, shape and relative position of each object on each layer of the IC that is to form the device descried by the cell. An IC designer typically generates an IC design initially in the form of a netlist describing the IC as a set of interconnected instances of those cells and then uses a placement and routing (P&R) tool to convert the netlist into an IC layout describing the position and orientation of each cell and the routes followed by the various conductors forming the nets that interconnect the cell instances. While the P&R tool determines the position and orientation of each cell, it does not generate or alter the layout of any cell instances; it simply copies the cell layouts included in the cell library.

Figure 1:
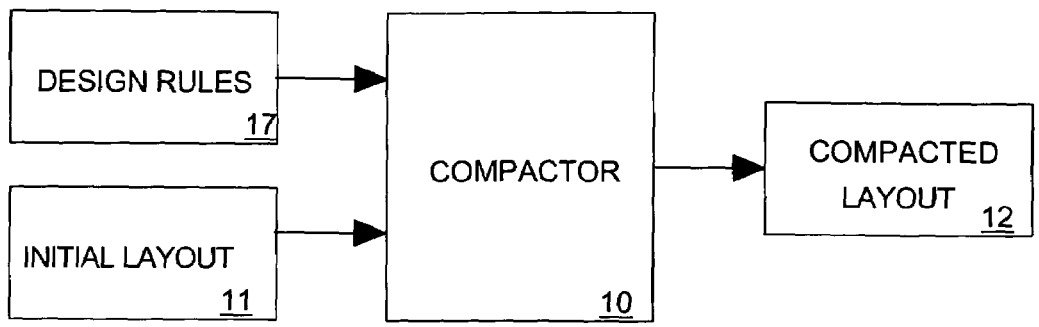
FIG. 1 is a data flow diagram illustrating a prior art IC layout compaction system.
Figure 2:
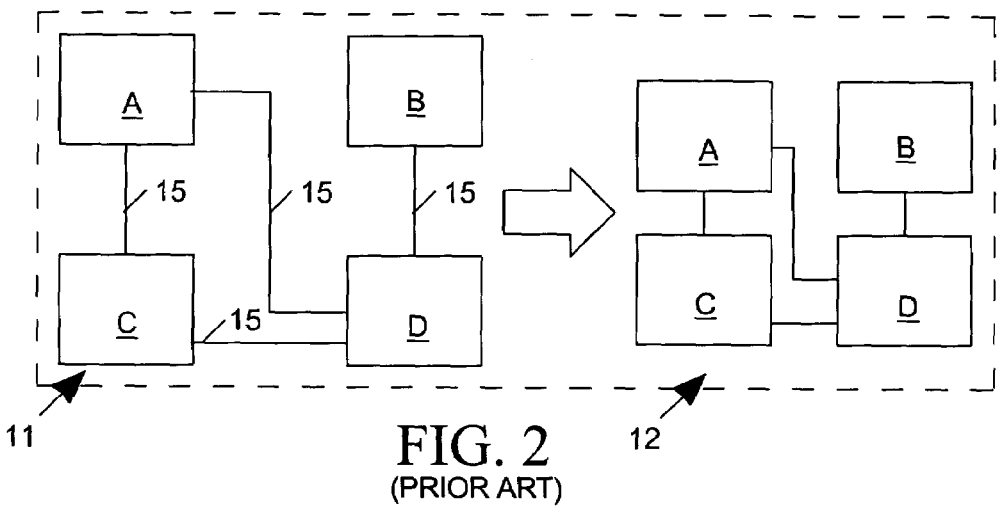
FIG. 2 depicts a plan view of a simple IC layout both before and after compaction by the prior art compactor of FIG. 1.
Figure 3:
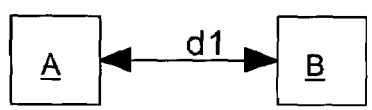
FIG. 3 is a plan view of two objects in an IC layout separated by a distance subject to one of the design rules of FIG. 1.
Figure 4:
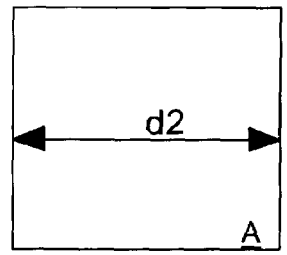
FIG. 4 is a plan view of an object in an IC layout having a dimension subject to one of the design rules of FIG. 1.
Figure 5:
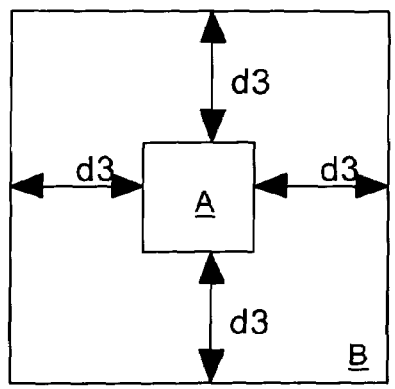
FIG. 5 is a plan view of two overlapping objects in an IC layout having edge spacing subject to one of the design rules of FIG. 1.
Figure 6A:
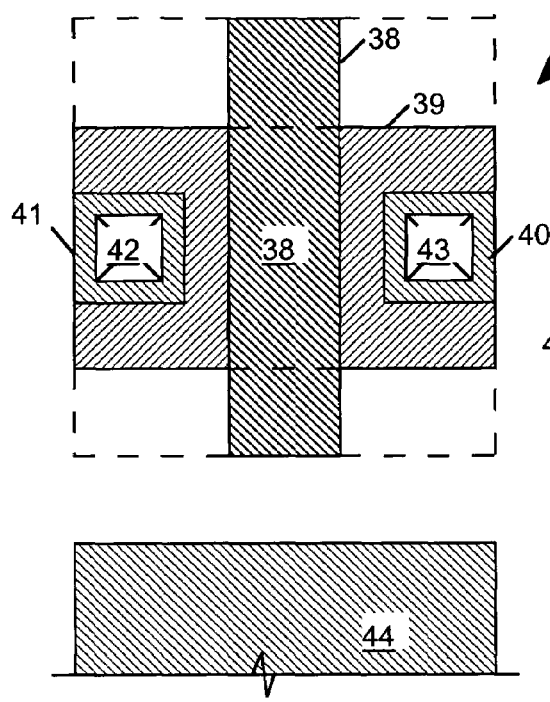
FIG. 6A is a plan view of two cells in an IC layout.
Figure 6B:
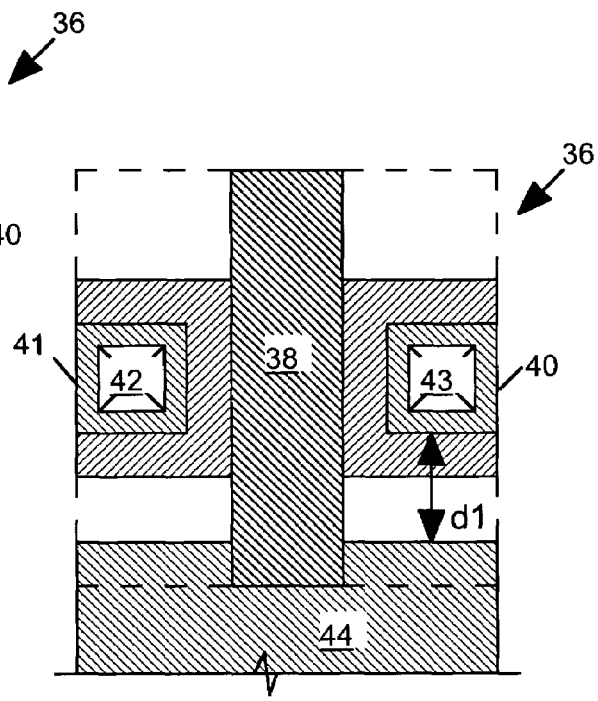
FIG. 6B is a plan view of the two cells of FIG. 6A after compaction by the prior art compactor of FIG. 1.
Figure 7:
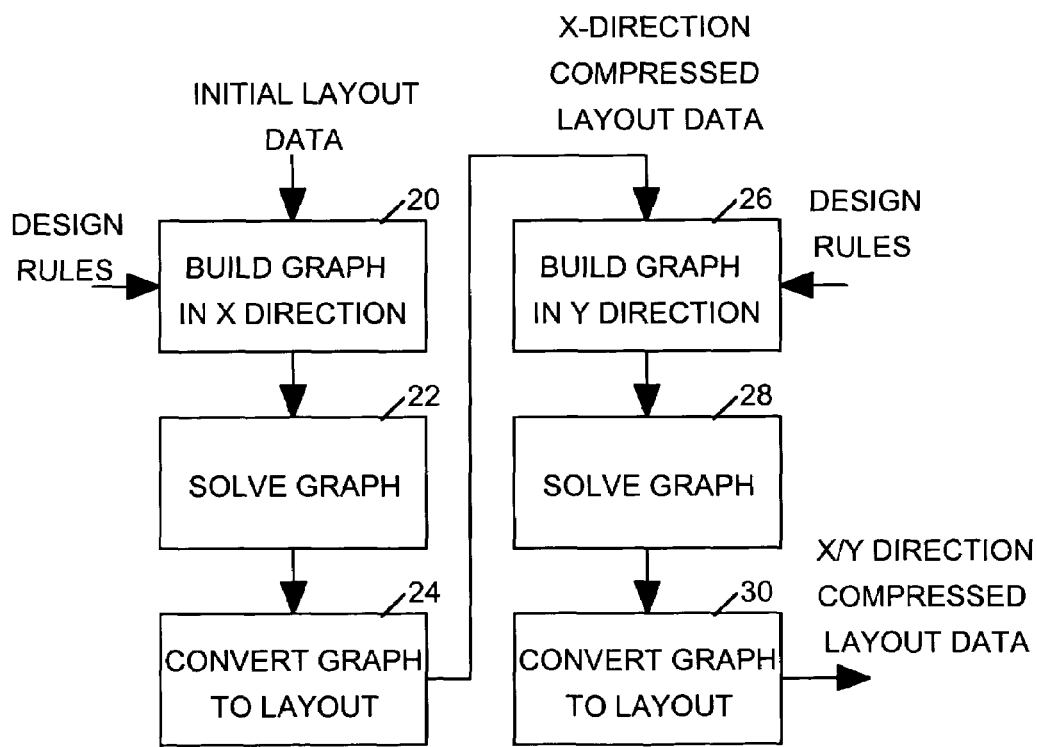
FIG. 7 is a data flow diagram illustrating the processing steps carried out by the prior art compactor of FIG. 1.
Figure 8:
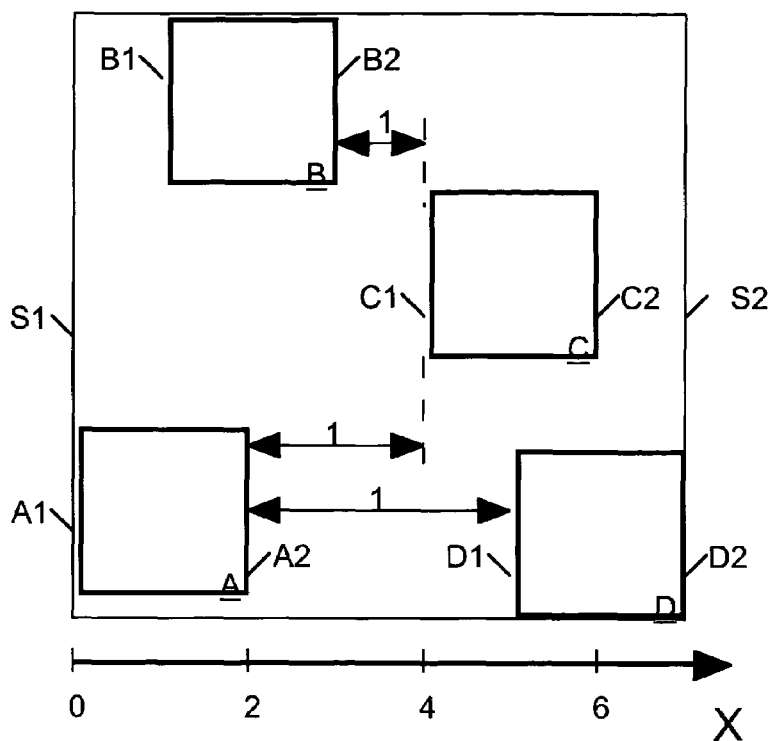
FIG. 8 is a plan view of a simple IC layout including four objects.
Figure 9:
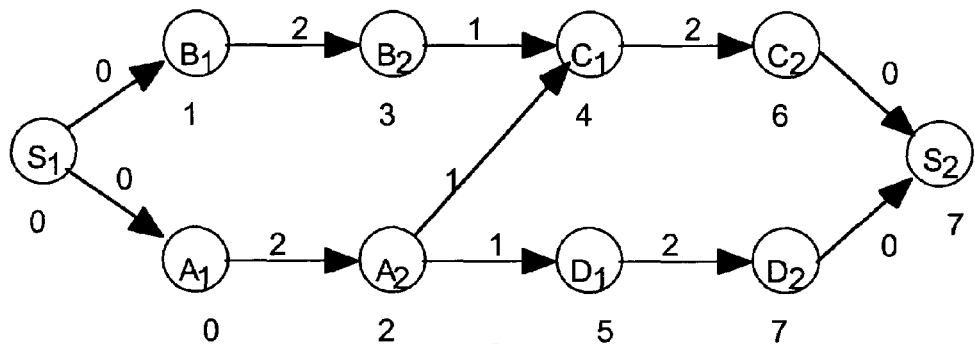
FIG. 9 is a graph constructed by the prior art compactor of FIG. 1 to represent constraints on the positions of object edges along the X axis of the layout of FIG. 8.
Figure 10:
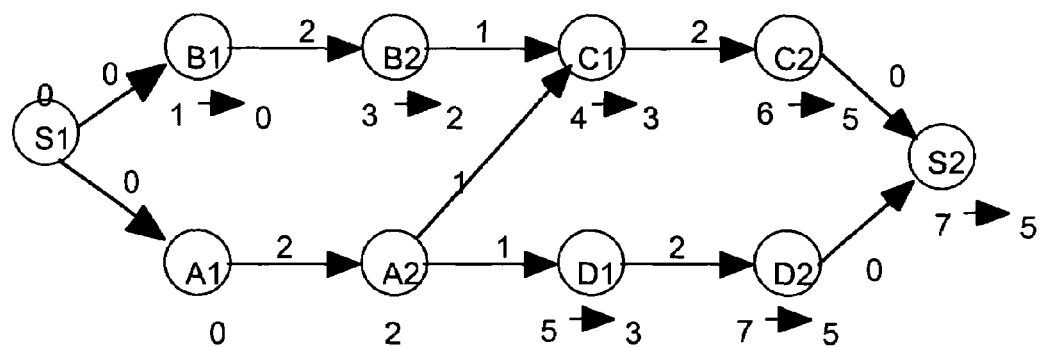
FIG. 10 is a graph constructed by the prior art compactor of FIG. 1 as a solution to the graph of FIG. 9 with respect to minimizing the width of the layout of FIG. 8 along the X-axis.
Figure 11:
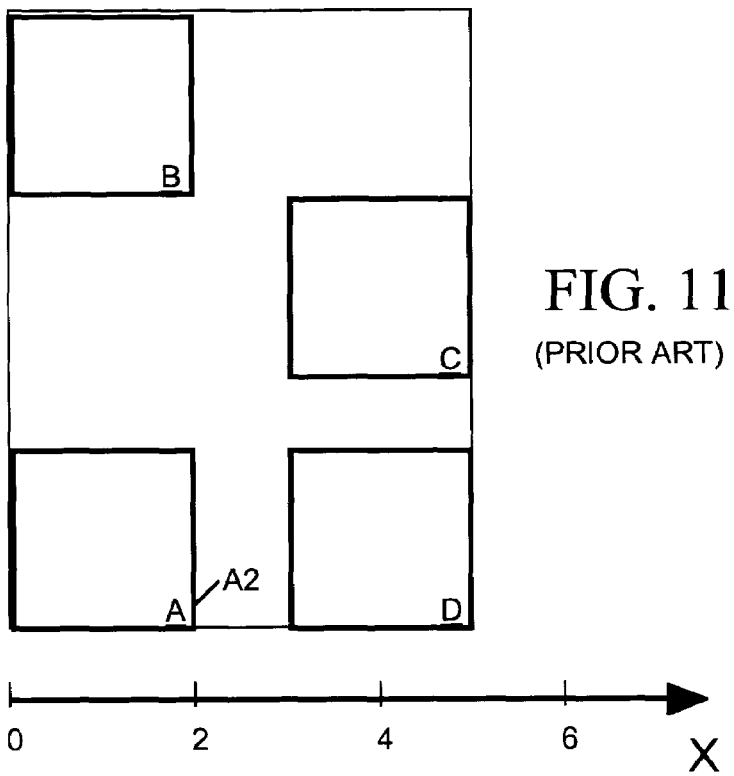
FIG. 11 is a version of the layout of FIG. 8 that has been compacted along the X-axis in accordance with the graph of FIG. 10.
Figure 12:
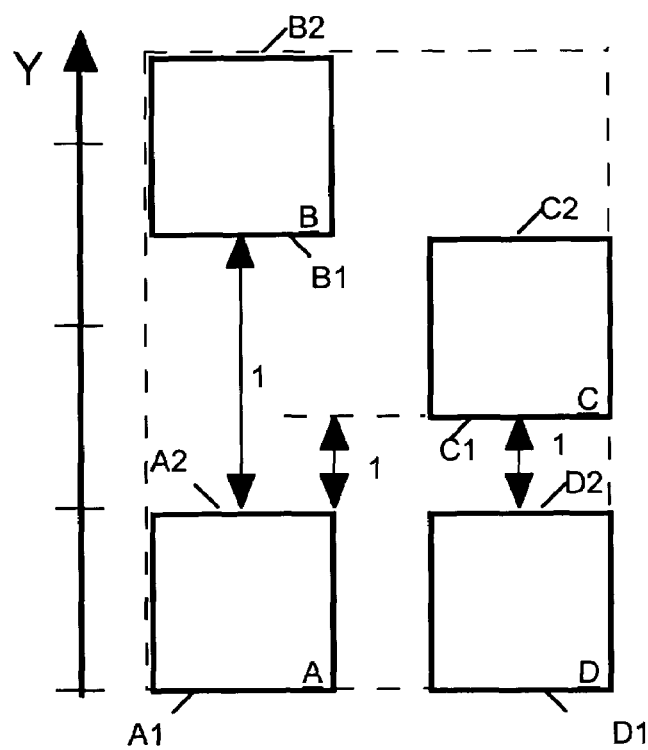
FIG. 12 depicts the X-direction compacted layout of FIG. 11 showing reference labels on object edges perpendicular to the Y-axis.
Figure 13:
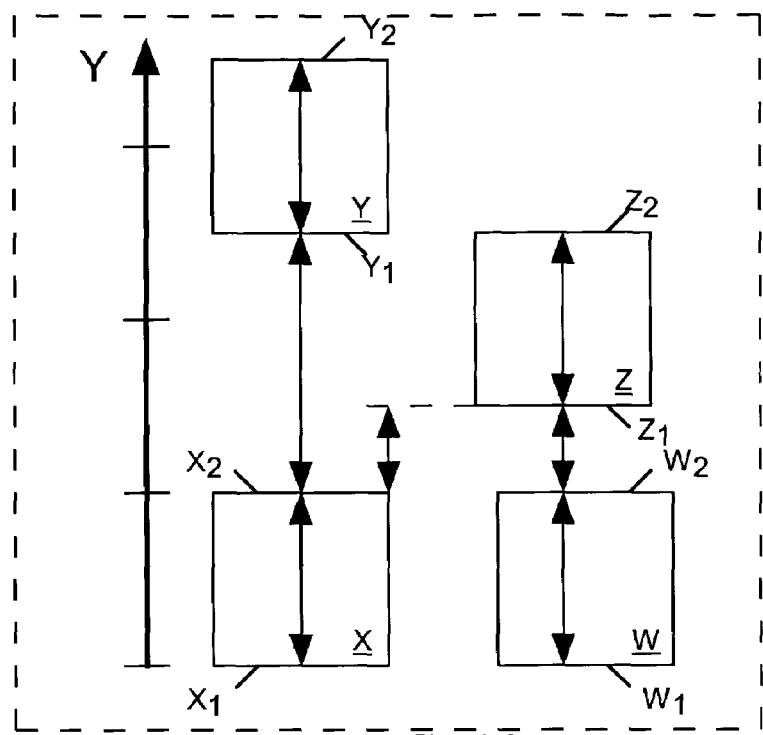
FIG. 13 is a graph constructed by the prior art compactor of FIG. 1 to represent constraints on the positions of object edges along the Y axis of the layout of FIG. 12.
Figure 14:
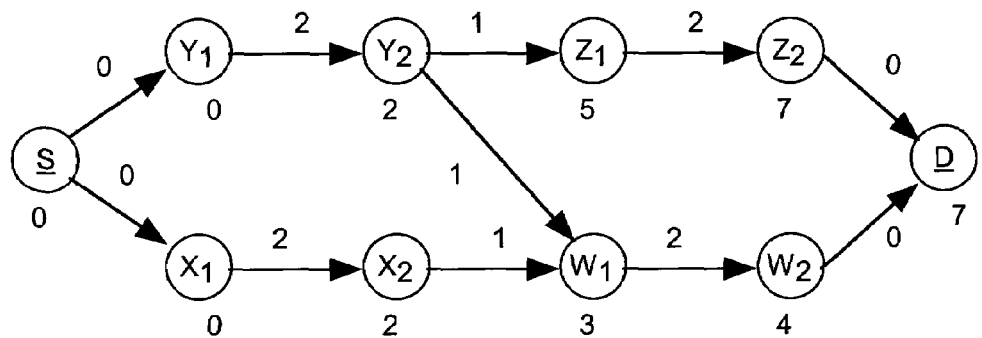
FIG. 14 is a graph constructed by the prior art compactor of FIG. 1 as a solution to the graph of FIG. 13 with respect to minimizing the width of the layout of FIG. 12 along the Y-axis.
Figure 15:
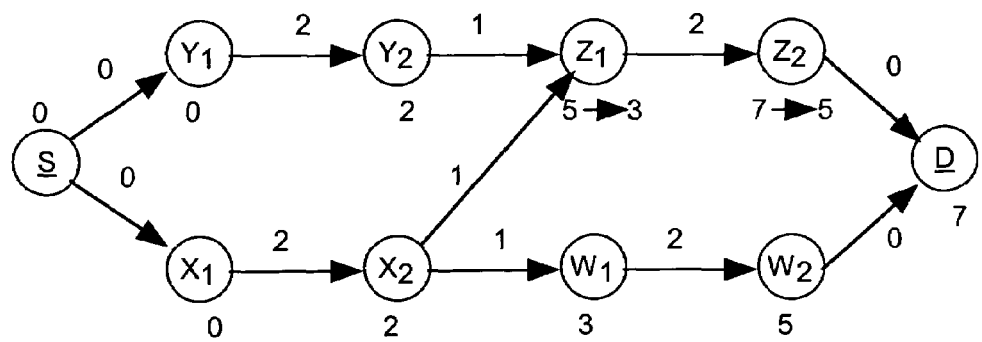
FIG. 15 is a version of the layout of FIG. 12 that has been compacted along the Y-axis in accordance with the graph of FIG. 14.
Figures 16, 17:
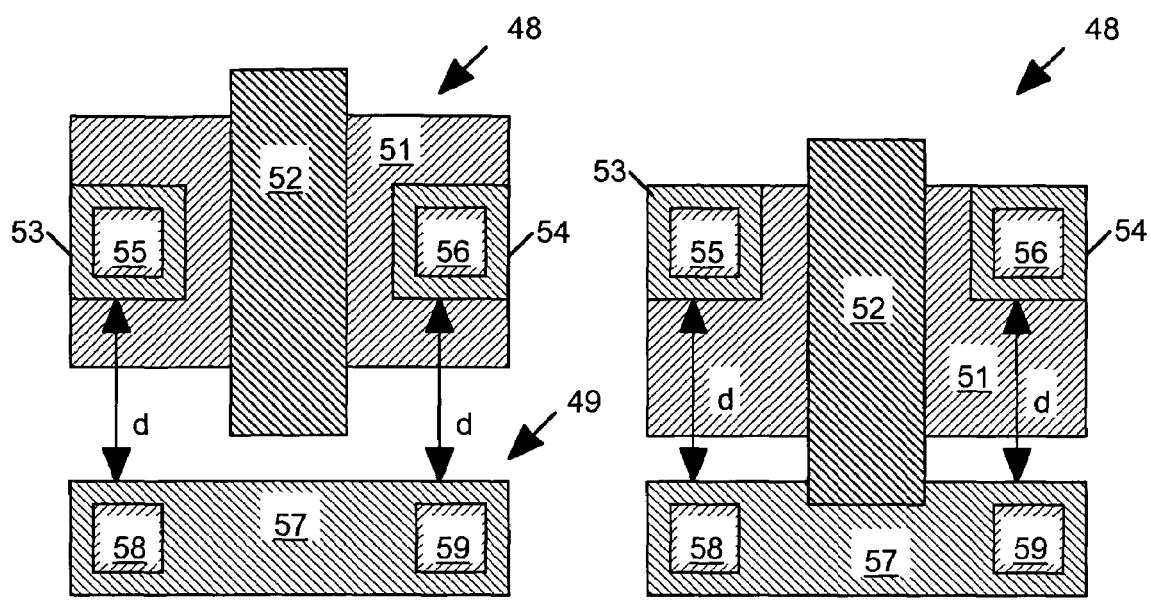
FIG. 16 is a plan view of two cells in an IC layout.
FIG. 17 is a plan view of the two cells of FIG. 16 after compaction by an integrated circuit layout compactor in accordance with the invention.

A conventional computer-aided IC compaction tool (a "compactor") modifies an IC layout by moving cells closer together so that the layout occupies less floor space within an IC. For example, as illustrated in FIG. 16 shows two cells 48 and 49. Cell 48 includes a set of six objects 51-56, while cell 49 includes three objects 57-59. A compactor could move cell instances 48 and 49 closer together in an IC layout to reduce the space they occupy, but design rules associated with the IC technology can place minimum limits on spacing between certain objects. For example, if a design rule indicates that object 57 of cell 49 and objects 53 and 54 of cell instance 48 must be at least some distance d apart, then a conventional compactor could not move cells instances 48 and 49 closer together if the separation between object 57 and objects 53 and 54 were already that minimum distance d apart. An improved compactor in accordance with the invention not only reduces the size of an IC layout by repositioning cell instances but also by rearranging the internal layouts of the cell instances. For example, a compactor in accordance with the invention could compact the layout of FIG. 16 to produce the layout of FIG. 17 by rearranging the layout of cell 48. Here the compactor has changed the positions of objects 53-56 relative to objects 51 and 52 within cell instance 48.

A compactor in accordance with the invention modifies the internal layout of a cell instance only when doing so helps to compact a layout and only when doing so does not affect the behavior of the device described by the cell instance. Thus for each cell for which some flexibility in internal layout is possible without affecting device behavior, there is provided in accordance with one aspect of the invention, a set of "device rules" limiting the manner in which the compactor can modify the layout. The device rules associated with a cell may, for example, specify minimum and/or maximum spacing between objects and minimum and/or maximum object dimensions. The compactor obeys these device rules when modifying the layout of any instance of a cell during the compaction process.

Figure 18:
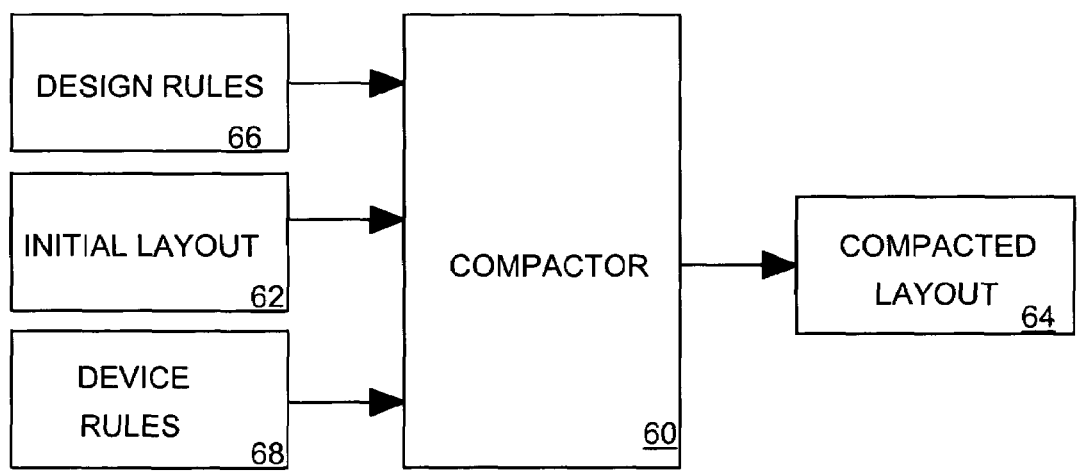
FIG. 18 is a data flow diagram illustrating an IC layout compaction system in accordance with the invention.

FIG. 18 depicts an IC layout compaction system (compactor) 60 in accordance with the invention for compressing an initial (uncompacted) IC layout 62 into a compacted layout 64. Like a conventional layout compactor, compactor 60 compacts the layout by repositioning cell instances and nets while taking into account a set of IC design rules 66 specifying constraints on spacing between various types of objects in the layout. However unlike a conventional compactor, compactor 60 may also modify the internal layout of cell instances subject to a set of device rules 68 placing constraints on how the compactor 60 can modify cell layouts.

Figure 19:
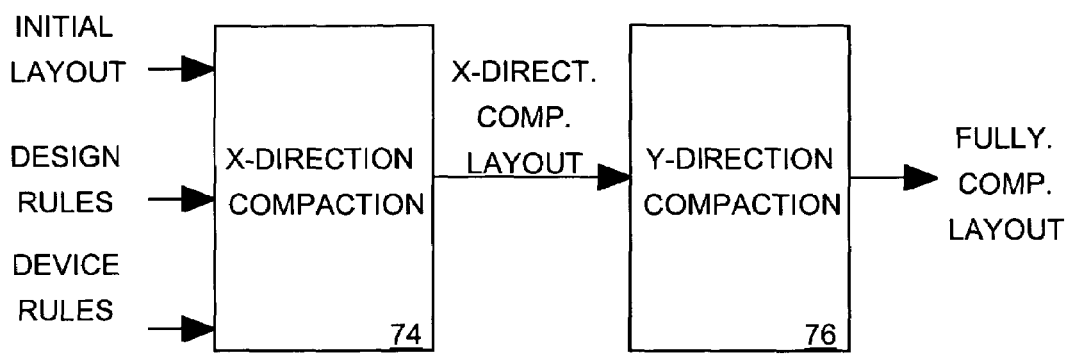
FIG. 19 is a data flow diagram illustrating operation of the compactor of FIG. 18.
Figure 20:
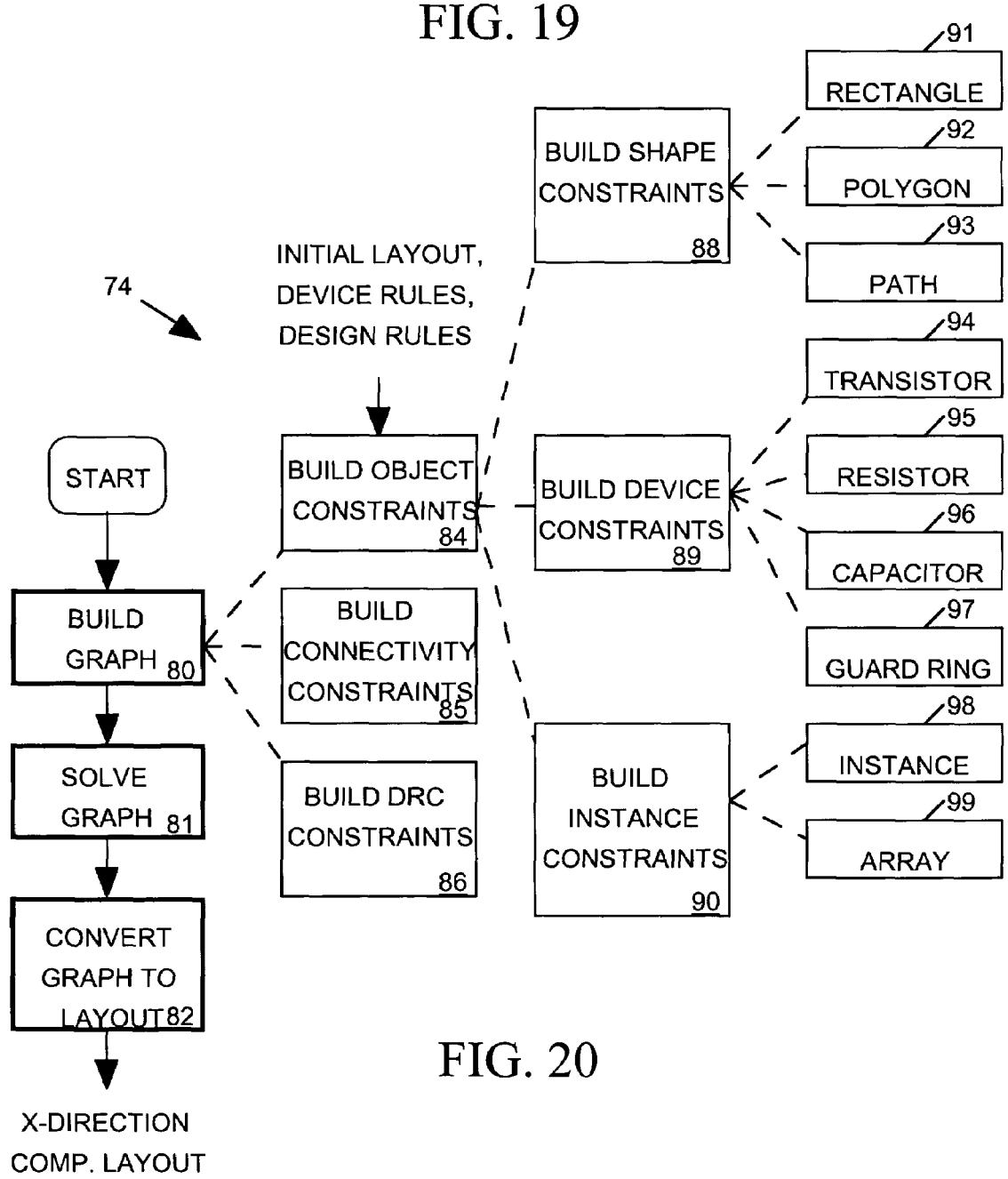
FIG. 20 is a data flow diagram illustrating the X-direction compaction step of FIG. 19 in more detail.

FIG. 19 is a data flow illustrating a two-step process compactor 60 of FIG. 18 carries out. Assuming that the initial layout in a plane having orthogonal X and Y directions, compactor 60 first compacts the uncompacted initial layout in the X direction in accordance with the design and device rules (step 74) to produce an X-direction compacted layout, and then compacts the X-direction compacted layout in the Y direction to produce a fully compacted layout. FIG. 20 is a data flow diagram illustrating the X-direction compaction step 74 in more detail. The Y-direction compaction step 76 is similar.

Referring to FIG. 20, compactor 60 builds a graph (step 80) modeling the x-direction dimensions and positions of all of the objects in the layout and indicating any constraints on those dimensions and positions. The compactor then solves the graph (step 81) to determine a position for each object that will minimize the width of the layout in its X dimension while satisfying all of the constraints imposed on the layout. The compactor then converts the solved layout into a new layout that is compacted in the X-direction (step 82).

In building the graph at step 80, the compactor determines constraints on all objects in the layout (step 84), on the connections between objects (step 85) and on spacing between objects imposed by design rules (step 86). In building the set of object constraints at step 84, the compactor builds shape constraints (step 88) on individual objects appearing in the layout that are not included in devices including rectangles (91), polygons (92) and signal paths (93).

Figure 21:
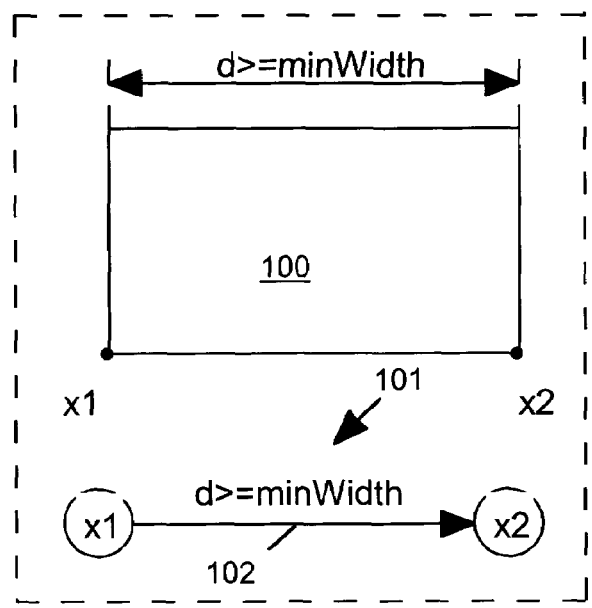
FIGS. 21-31 illustrates plan views of objects in an IC layout along with subgraphs created by the compactor of FIG. 18 to represent the relative positions of and constraints on spacing between edges of the objects that are perpendicular to an X or Y axis of the layout.

FIG. 21 depicts an example rectangular object 100 as might appear in a cell instance layout having a device rule limiting its width d in the X direction to being at least as large as the value of a parameter minWidth. The compactor would represent this object in the X-direction graph built at step 80 (FIG. 20) as a subgraph 101 including two nodes x1 and x2 representing the left and right sides of the rectangle and a directed edge 102 linking the two nodes and representing a spatial relationship between the two edges x1 and x2. The arrow head of edge 102 indicates that side X1 is constrained to residing in the −X direction of side x2 and an expression the compactor has associated with edge 102 indicates that side x1 and x2 must be separated by at least the value of minWidth.

Figure 22:
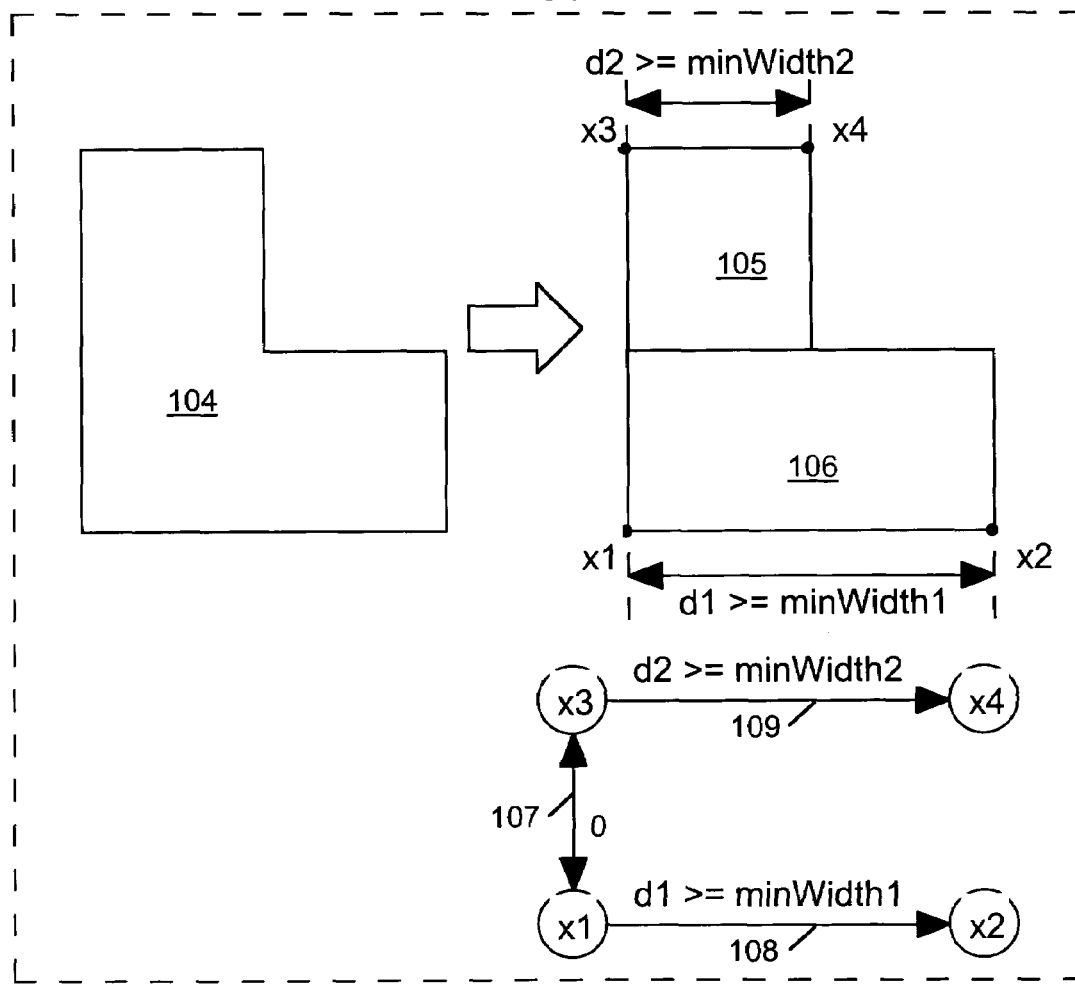

FIG. 22 illustrates how the compactor models a polygon 104 appearing a cell instance layout when building the graph at step 80 of FIG. 20. The compactor initially converts each polygon into a set of rectangles. In this example the compactor is able to use two rectangles 105 and 106 to represent polygon 104. Design rules limit the X direction minimum width of rectangle 105 to the value of a parameter min-Width2 and limit the X direction minimum width of rectangle 106 to the value of a parameter minWidth1. The compactor then builds a subgraph 107 of the IC layout graph representing the two rectangles, the subgraph including a set of four nodes x1-x4 representing the +X and −X direction sides of the two rectangles 105 and 106 and a set of vertices 107-109 interconnecting the nodes to represent spatial relationships between the rectangle edges. The edge 107 between nodes x1 and x3 indicates that the relative order of sides x1 and X3 is constrained, but the value of 0 assigned to the edge indicates that there must be 0 spacing between the two edges. The edge 108 between nodes x1 and x2 indicates side x2 must reside to the +X direction from x1 and the expression assigned to the edge indicates that the width of rectangle 106 must be at least as large as the value of a parameter minWidth1. The edge 109 between nodes x3 and x4 indicates side x4 must reside in the +X direction from x3 and the expression assigned to the edge indicates that the width of rectangle 105 must be at least as large as the value of a parameter minWidth2.

Figure 23:
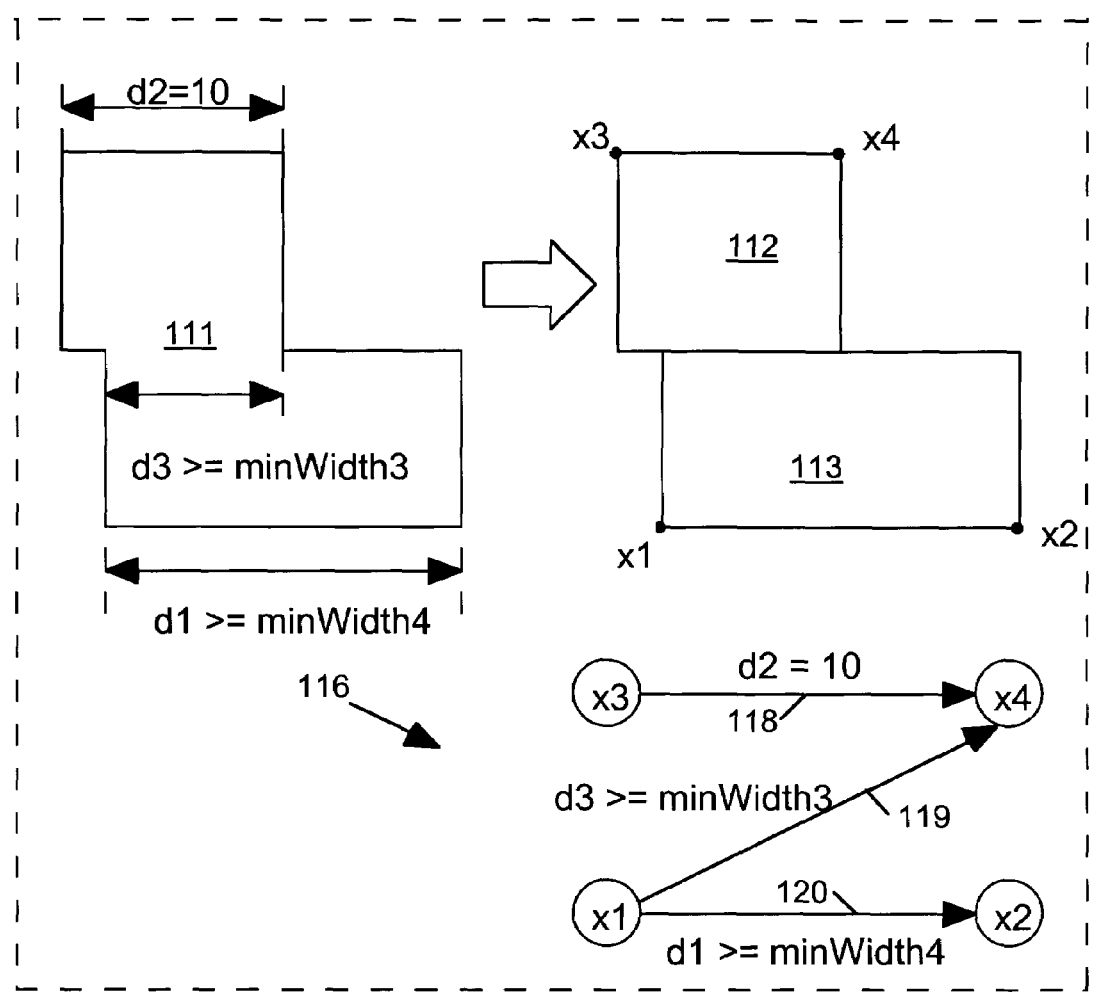

FIG. 23 illustrates how the compactor models another polygon 111 appearing in the layout when building the graph at step 80 of FIG. 18. The compactor uses two rectangles 112 and 113 to represent polygon 111 and then builds a section 116 of the layout graph representing the two rectangles including a set of four nodes x1-x4 representing the +X and −X direction sides of the two rectangles 112 and 113 and a set of vertices 118-120 interconnecting the nodes to represent spatial relationships between the rectangle edges. In accordance with design rules associated with the cell, the edge 118 between nodes x3 and x4 indicates that edges x3 and x4 of rectangle must be a fixed 10 distance units apart and that node x4 must be in the +X direction of x3. The edge 119 between nodes x1 and x4 indicates side x4 must reside to the +X direction from side x1 and the expression assigned to the edge indicates that the edges x1 and x4 must be separated by a distance d3 that is at least as large as the value of a parameter minWidth3. The edge 120 between nodes x1 and x2 indicates side x2 must reside in the +X direction from side x1 and the expression assigned to the edge indicates that the width d1 of rectangle 113 must be at least as large as the value of a parameter minWidth4.

Figure 24:
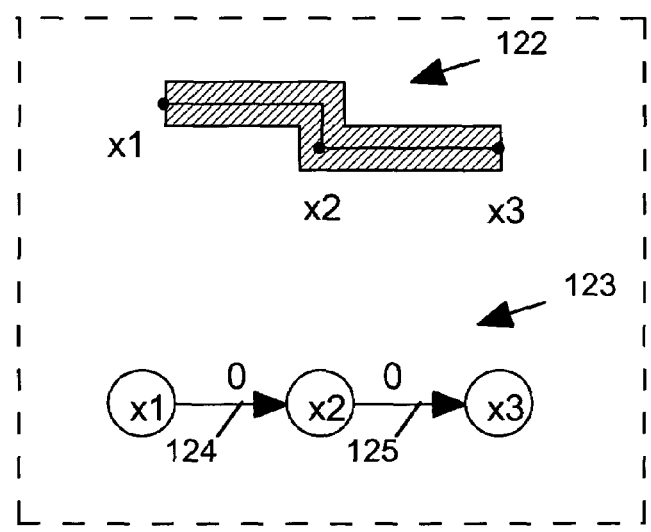

FIG. 24 depicts an example path 122 as might be formed by a set of conductors to provide a net between a set of points x1, x2 and x3. To model path 122 in the X-direction, the compactor creates a subgraph 123 including three nodes x1-x3 interconnected by vertices 124 and 125. The directed vertices indicate that there is no minimum distance between points x1, x2 and x3 but that the points are to maintain a particular order in the X direction.

Figure 25:
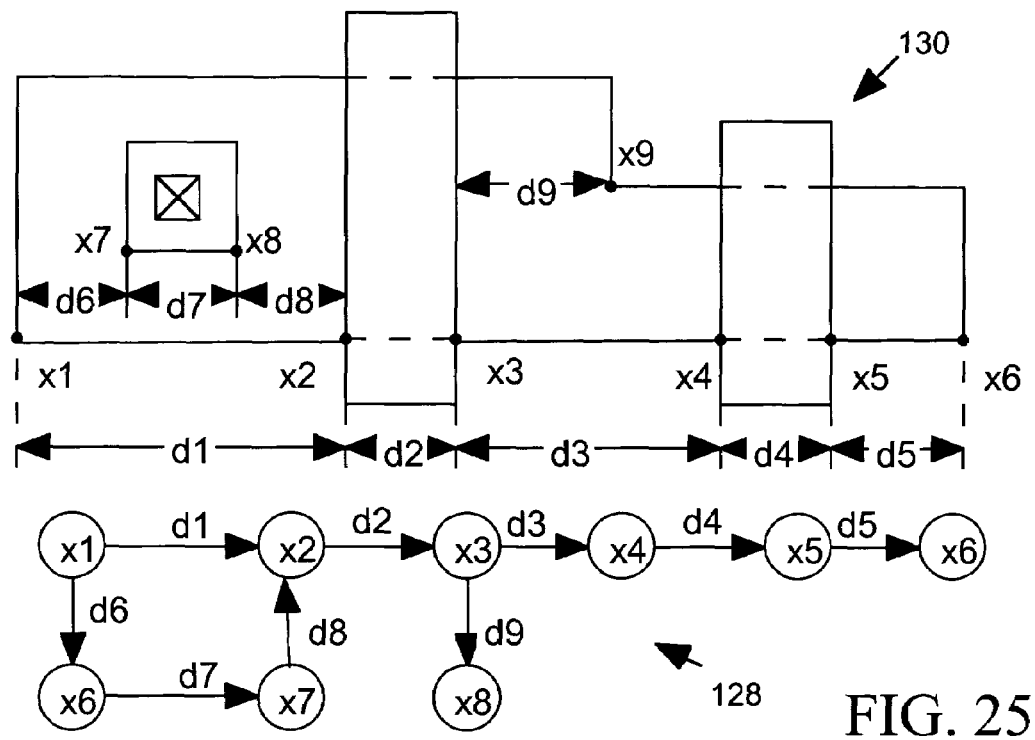

FIG. 25 shows how the compactor forms an X-direction graph 128 for a device 130 such as a transistor consisting of several rectangular objects. The device model uses parameters d1-d9 to constrain X direction dimensions of and spacing between the various objects. The compactor establishes a node x1-x9 within graph 128 for every rectangle side along the X-direction and creates a separate edge in graph 128 for each constraint parameter d1-d9 appropriately linking the nodes representing the object sides subject to the constraint.

Figure 26:
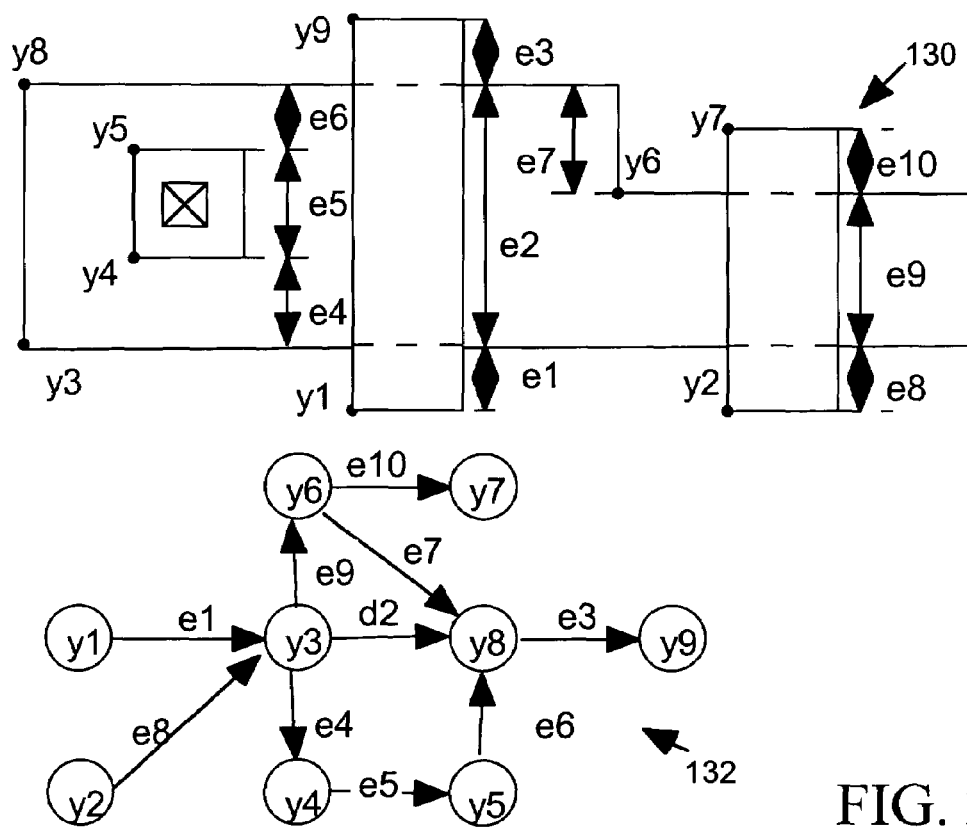

FIG. 26 shows how the compactor forms a Y-direction graph 132 for device 130 of FIG. 25 where the device model uses parameters e1-e10 to constrain Y direction dimensions of and spacing between the various objects. The compactor establishes a node y1-y9 within graph 132 for every rectangle side along the Y-direction and creates a separate edge in graph 132 for each constraint parameter e1-e10 appropriately linking the nodes representing the object sides subject to the constraint.

Figure 27:
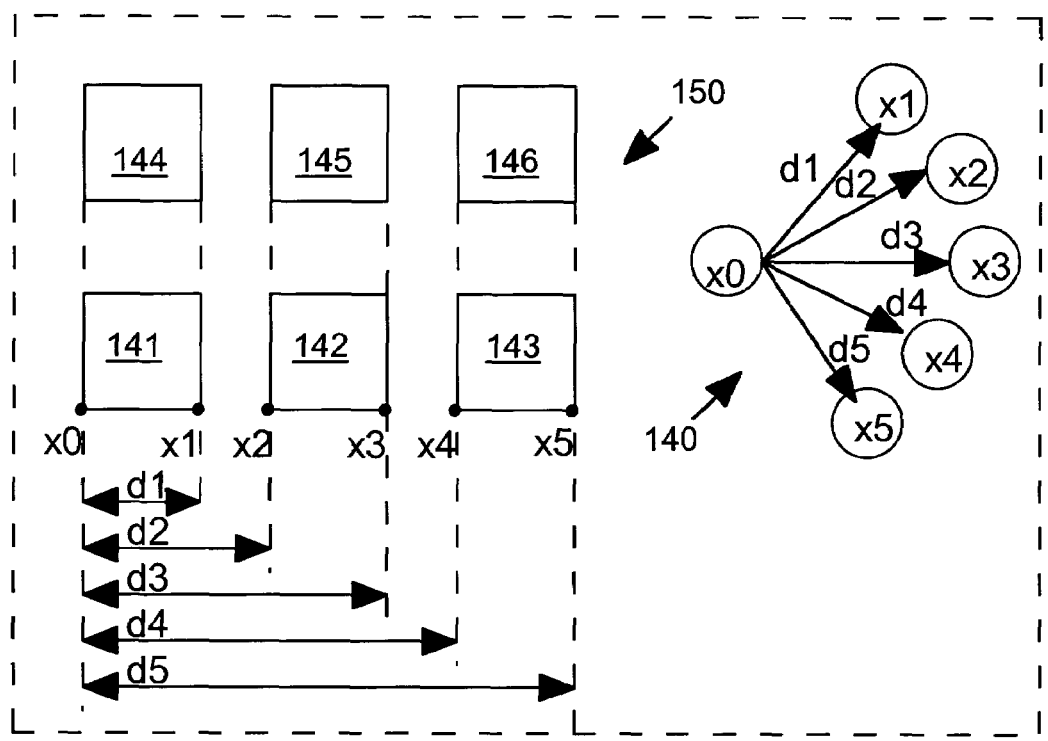

FIG. 27 illustrates how the compactor would form an X-direction graph 140 to model an array 150 of objects 141-146 in an example where placement constraints d1-d5 on edges x0-x5 are referenced to the left-most edge x0 of the left-most object 141.

Figure 28:
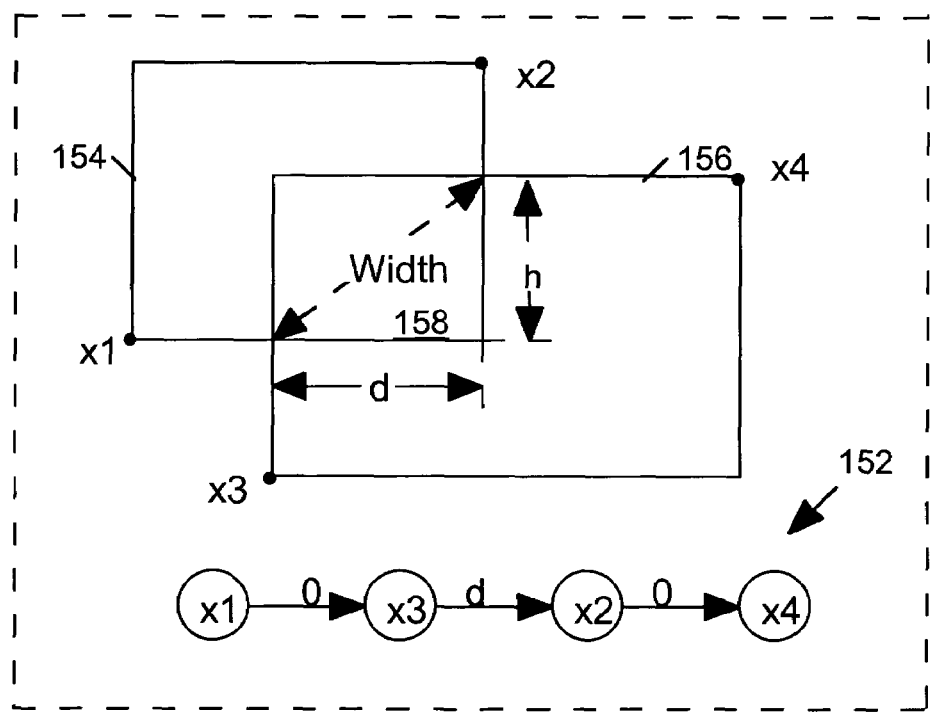

FIG. 28 shows an X-direction graph 152 the compactor would generate to model a pair of objects 154 and 156 in which the length of the diagonal of an area 158 of intersection is subject to a minimum width constraint (width). The model 152 assigns a value d to the horizontal distance between the left edge x3 of object 156 and the right edge x2 of object 154, where $$d=\sqrt{\text{width}^2-h^2}$$

and h is the amount of object overlap in the Y direction. When building a graph to model objects 154 and 156 in the Y direction, the compactor places the following constraint on h:

$$h=\sqrt{\text{width}^2-d^2}$$

Figure 29:
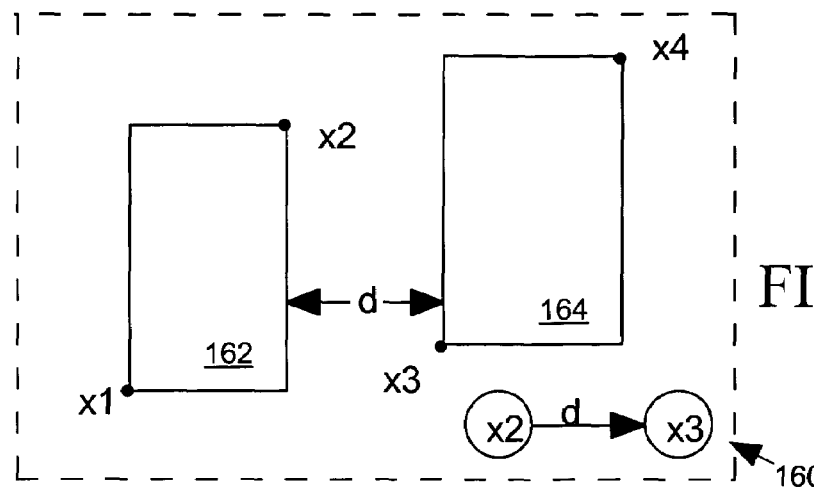

FIG. 29 shows an X-direction graph 160 the compactor would generate to model a pair of objects 162 and 164 for which design rules provide for a minimum horizontal spacing (minSpacing). The model 160 assigns a value d>=minspacing to the horizontal distance between the right edge x2 of object 162 and the left edge x3 of object 164.

Figure 30:
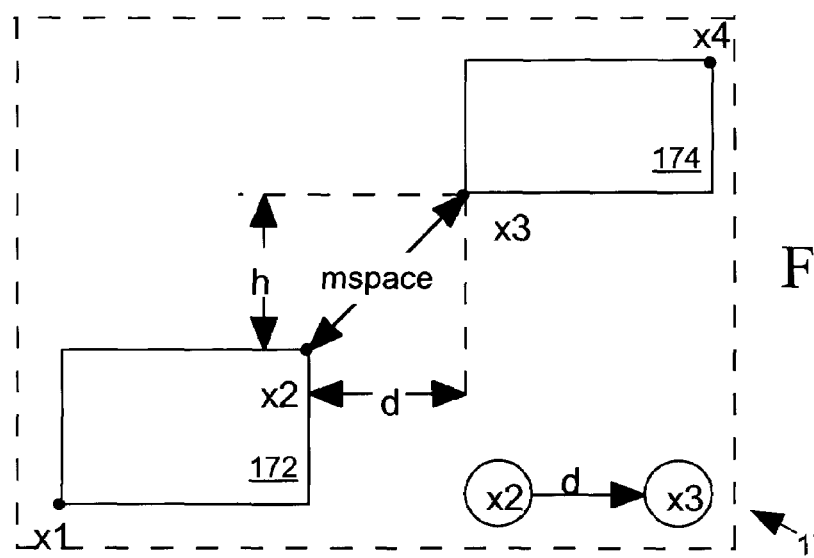

FIG. 30 shows an X-direction graph 170 the compactor would generate to model a pair of objects 172 and 174 for which design rules specify a minimum spacing (mspace) between objects in any direction. The compactor assigns a parameter d the horizontal distance between the right edge x2 of object 172 and the left edge x3 of object 174 and assigns a parameter h to the vertical distance between the two objects where, $$d=\sqrt{\text{mspace}^2-h^2}$$

when building a graph in the Y direction, the compactor places the following constraint on h:

$$h=\sqrt{\text{mspace}^2-d^2}$$

Figure 31:
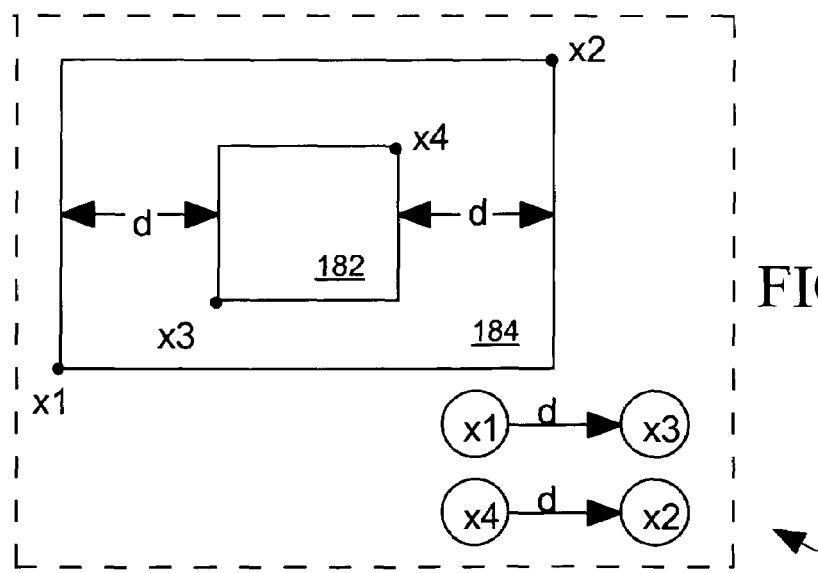

FIG. 31 shows an X-dimension graph 180 the compactor generators to model a pair of objects 182 and 184 where object 182 resides inside object 184 and design rules include an enclosure rule imposing a minimum spacing d between edges of the two objects. The X-dimension graph 180 shows the left edges X1 and X3 and the right edges X2 and X4 are to be separated by minimum distance d.

Thus has been shown and described, a method for compacting a layout for an integrated circuit (IC) having a plurality of cell instances, each cell instance describing a structure of a separate electronic device to be incorporated into the IC, and having a plurality of path objects, each path object describing a structure for interconnecting electronic devices to be incorporated into the IC. The internal layout of each cell instance includes one or more device objects each corresponding to a separate portion of IC material that is to form the corresponding electronic device. The shape and position of each device object within the internal layout of the cell instance defines a shape and position of its corresponding portion of IC material within the electronic device described by the cell instance. The distances between edges of path and device objects are subject to constraints imposed by a set of design rules. In accordance with the invention, set of device rules are created to indicate how modifications to internal layouts of the cell instances can be made without affecting a behavior of the electronic devices the cell instances describe. Thereafter the layout is compacted in accordance with the design rules and the device rules not only by repositioning cell instances and path objects within the layout and by modifying path objects, but also by modifying the internal layouts of cell instances. The device rules can allow the compactor to alter dimensions of objects within the cell instances and to alter the spacing between separate objects within an a cell instance when doing so helps to compact an IC layout without altering the function of the device the cell instance describes.

The foregoing specification and the drawings depict exemplary embodiments of the best mode(s) of practicing the invention, and elements or steps of the depicted best mode(s) exemplify the elements or steps of the invention as recited in the appended claims. However, the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. A method for
modifying an integrated circuit (IC) layout based on a cell library containing a plurality of cells,
wherein each cell corresponds to a separate electronic device that can be incorporated into the IC and describes a layout for its corresponding electronic device as comprising a set of device objects, each device object being formed of a single type of IC material, and each cell indicating a shape and position of each device object within the layout of its corresponding electronic device,
wherein the IC layout describes positions and orientations of a plurality of cell instances, each cell instance being a layout for a corresponding electronic device and being derived from a layout described a corresponding one of the cells'
wherein the IC layout also describes shapes, positions and orientations of a plurality of path objects forming nets for interconnecting electronic devices corresponding to the cell instances, each path object being formed of a single type of IC material,
wherein device objects and path objects within the IC layout have edges, and
wherein distances between edges of path and device objects are subject to constraints imposed by a set of design rules,
the method comprising the steps of:
a. providing a separate set of device rules corresponding to each cell, each set of device rules indicating how modifications to the layout described by the corresponding cell can be made without affecting a behavior of the electronic device corresponding to the cell, and
b. altering the IC layout in accordance with the design rules
by repositioning cell instances and path objects within the IC layout,
by modifying path objects, and
by modifying the internal layout of at least one cell instance of the plurality of cell instances in accordance with the device rules corresponding to the cell from which the at least one cell instance was derived.

2. The method in accordance with claim 1 wherein the device rules indicate that the at least one cell instance can be modified by altering a distance between edges of two device objects included within the at least one cell instance.

3. The method in accordance with claim 2 wherein the device rules specify that at least one cell instance can be modified by altering the distance between the edges of the two device objects to any distance within an indicated range of distances, and
wherein the at least one cell instance is modified at step b by repositioning at least one of the two device objects so that the distance between their edges resides within the indicated range of distances.

4. The method in accordance with claim 1
wherein the device rules indicate the least one cell instance can be modified by altering a distance between two edges of a device object included within the at least one cell instance.

5. The method in accordance with claim 4
wherein the device rules specify that the at least one cell instance can be modified by altering the distance between the two edges of the device object included the at least one cell instance to any distance within an indicated range of distances, and
wherein the least one cell instance is modified at step b by altering a dimension of the device object so that the distance between its two edges resides within the indicated range of distances.

6. The method in accordance with claim 1
wherein the at least one cell instance includes two overlapping device objects,
wherein the design rules indicate that an area of overlap between the two device objects is to be at least of a minimum size, and
wherein the at least one cell instance is modified at step b by repositioning at least one of the two overlapping device objects to alter their area of overlap to a value at least as large as the specified minimum size.

7. The method in accordance with claim 1 wherein the IC layout has an X axis and has a Y axis orthogonal to the X axis, wherein each device and path object edge is perpendicular to one of the X and Y axes of the IC layout, and wherein step b comprises the substeps of:
b1. creating a first graph comprising a plurality of nodes and vertices, wherein each node represents a separate one of the edges that is perpendicular to the X axis and indicates a position of that edge along the X axis within the IC layout, wherein each of the vertices links two of the nodes and indicates all constraints the design rules and device rules place on relative ordering of the edges corresponding to the two nodes the edge links and on spacing between the edges corresponding to the two nodes; and b2. processing the first graph to find a position along the X axis for each path and device object edge that is perpendicular to the X axis that will reduce a first dimension of the IC layout along its X axis in a manner consistent with the design rules and the device rules.

8. The method in accordance with claim 7 wherein step b further comprises the substep of:

b3. modifying the layout so that each path and device object edge that is perpendicular to the X axis has the position along the X axis found at step b2.

9. The method in accordance with claim 8 wherein step b further comprises the substeps of:

b4. creating a second graph comprising a plurality of nodes and vertices, wherein each node represents a separate one of the edges that is perpendicular to the Y axis and indicates a position of that edge along the Y axis within the IC layout, wherein each of the vertices links two of the nodes and indicates constraints the design rules and device rules place on relative ordering of the path and device object edges corresponding to the two nodes the edge links and on spacing between the path and device object edges corresponding to the two nodes; and b5. processing the second graph to find a position along the Y axis for each path and device object edge that is perpendicular to the Y axis that will reduce a second dimension of the IC layout along its Y axis in a manner consistent with the design rules and the device rules.

10. The method in accordance with claim 9 wherein step b further comprises the substep of:

b6. further modifying the layout so that each path and device object edge that is perpendicular to the Y axis has the position along the Y axis found at step b5.

11. Computer-readable media storing software which, when read and executed by a conventional computer causes the computer to carry out a method modifying an integrated circuit (IC) layout based on a plurality of cells, wherein each cell corresponds to a separate kind of electronic device incorporated into the IC and describes a layout for its corresponding electronic device as comprising a set of device objects, each device object being formed of a single type of IC material, and each cell indicating a shape and position of each device object within the layout of its corresponding electronic device, wherein the IC layout describes positions and orientations of a plurality of cell instances, each cell instance being a layout for a corresponding electronic device and being derived from a layout described a corresponding one of the cells' wherein the IC layout also describes shapes, positions and orientations of a plurality of path objects forming nets for interconnecting electronic devices corresponding to the cell instances, each path object being formed of a single type of IC material, wherein device objects and path objects within the IC layout have edges, and wherein distances between edges of path and device objects are subject to constraints imposed by a set of design rules, the method comprising the steps of:

a. providing a separate set of device rules corresponding to each cell, each set of device rules indicating how modifications to the layout described by the corresponding cell can be made without affecting a behavior of the electronic device corresponding to the cell, and b. altering the IC layout in accordance with the design rules by repositioning cell instances and path objects within the IC layout, by modifying path objects, and by modifying the internal layout of at least one cell instance of the plurality of cell instances in accordance with the device rules corresponding to the cell from which the at least one cell instance was derived.

12. The computer-readable media in accordance with claim 11 wherein the device rules indicate that the at least one cell instance can be modified by altering a distance between edges of two device objects included within of the at least one cell instance.

13. The computer-readable media in accordance with claim 12 wherein the device rules specify that at least one cell instance can be modified by altering the distance between the edges of the two device objects to any distance within an indicated range of distances, and wherein the at least one cell instance is modified at step b by repositioning at least one of the two device objects so that the distance between their edges resides within the indicated range of distances.

14. The computer-readable media in accordance with claim 11 wherein the device rules indicate the least one cell instance can be modified by altering a distance between two edges of a device object included within the at least one cell instance.

15. The computer-readable media in accordance with claim 14 wherein the device rules specify that the at least one cell instance can be modified by altering the distance between the two edges of the device object included the at least one cell instance to any distance within an indicated range of distances, and wherein the least one cell instance is modified at step b by altering a dimension of the device object so that the distance between its two edges resides within the indicated range of distances.

16. The computer-readable media in accordance with claim 11 wherein the at least one cell instance includes two overlapping device objects, wherein the design rules indicate that an area of overlap between the two device objects is to be at least of a minimum size, and wherein the at least one cell instance is modified at step b by repositioning at least one of the two overlapping device objects to alter their area of overlap to a value at least as large as the specified minimum size.

17. The computer-readable media in accordance with claim 11 wherein the IC layout has an X axis and has a Y axis orthogonal to the X axis, wherein each object edge is perpendicular to one of the X and Y axes of the IC layout, and wherein step b comprises the substeps of:

b1. creating a first graph comprising a plurality of nodes and vertices, wherein each node represents a separate one of the edges that is perpendicular to the X axis and indicates a position of that edge along the X axis within the IC layout, wherein each of the vertices links two of the nodes and indicates all constraints the design rules and device rules place on relative ordering of the edges corresponding to the two nodes the edge links and on spacing between the edges corresponding to the two nodes; and b2. processing the first graph to find a position along the X axis for each path and device object edge that is perpendicular to the X axis that will reduce a first dimension of the IC layout along its X axis in a manner consistent with the design rules and the device rules.

18. The computer-readable media in accordance with claim 17 wherein step b further comprises the substep of:

b3. modifying the layout so that each path and device object edge that is perpendicular to the X axis has the position along the X axis found at step b2.

19. The computer-readable media in accordance with claim 8 wherein step b further comprises the substeps of:

b4. creating a second graph comprising a plurality of nodes and vertices, wherein each node represents a separate one of the edges that is perpendicular to the Y axis and indicates a position of that edge along the Y axis within the IC layout, wherein each of the vertices links two of the nodes and indicates constraints the design rules and device rules place on relative ordering of the path and device object edges corresponding to the two nodes the edge links and on spacing between the path and device object edges corresponding to the two nodes; and b5. processing the second graph to find a position along the Y axis for each path and device object edge that is perpendicular to the Y axis that will reduce a second dimension of the IC layout along its Y axis in a manner consistent with the design rules and the device rules.

20. The computer-readable media in accordance with claim 19 wherein step b further comprises the substep of:

b6. further modifying the layout so that each path and device object edge that is perpendicular to the Y axis has the position along the Y axis found at step b5.

* * * * *